United States Patent [19]

Moreau

[11] Patent Number: 4,823,091

[45] Date of Patent: Apr. 18, 1989

[54] FREQUENCY-VOLTAGE CONVERTER

[75] Inventor: Jean-Michel Moreau, Grenoble, France

[73] Assignee: Thomson Semiconducteurs, Paris, France

[21] Appl. No.: 126,852

[22] Filed: Nov. 30, 1987

[30] Foreign Application Priority Data

Dec. 2, 1986 [FR] France .................................. 86 16807

[51] Int. Cl.$^4$ ........................ H03K 5/00; H03K 17/56; H03K 5/22
[52] U.S. Cl. .................................... 328/140; 328/141; 328/142; 307/246; 307/261; 307/494
[58] Field of Search ............... 307/246, 261, 490, 491, 307/494, 498; 328/140, 141, 142, 34, 35, 36

[56] References Cited

U.S. PATENT DOCUMENTS

| | | | |
|---|---|---|---|
| 3,569,737 | 3/1971 | Bauer | 328/140 |
| 3,697,781 | 10/1972 | McLean | 307/246 |
| 3,883,754 | 5/1975 | Fleischer et al. | 328/142 |
| 4,197,508 | 4/1980 | Takaoka | 307/246 |
| 4,214,299 | 7/1980 | Nakagaki et al. | 328/141 |

FOREIGN PATENT DOCUMENTS

| | | |
|---|---|---|
| 2031707 | 12/1971 | Fed. Rep. of Germany . |
| 2655550 | 6/1978 | Fed. Rep. of Germany . |
| 586396 | 3/1977 | Switzerland . |

*Primary Examiner*—Stanley D. Miller
*Assistant Examiner*—Trong Quang Phan
*Attorney, Agent, or Firm*—Oblon, Fisher, Spivak, McClelland & Maier

[57] ABSTRACT

The invention provides a frequency-voltage converter having a voltage source; a first capacitor, a second capacitor, a current generator and a sequencer receiving a recurrent signal; said first capacitor being charged to a value Vo after a time To, then discharged by a discharge current Jd proportional to the square of the instantaneous residual voltage in said first capacitor, during a time T-To; the residual charge which is present in the first capacitor after the time T being recopied at the beginning of each recurrence into said second capacitor.

10 Claims, 2 Drawing Sheets

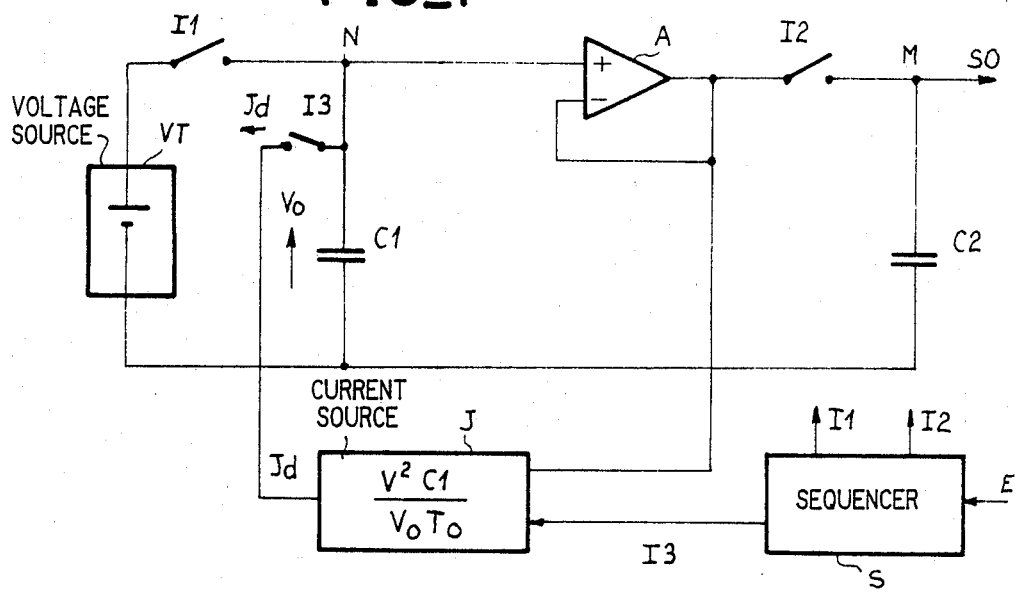
FIG_1
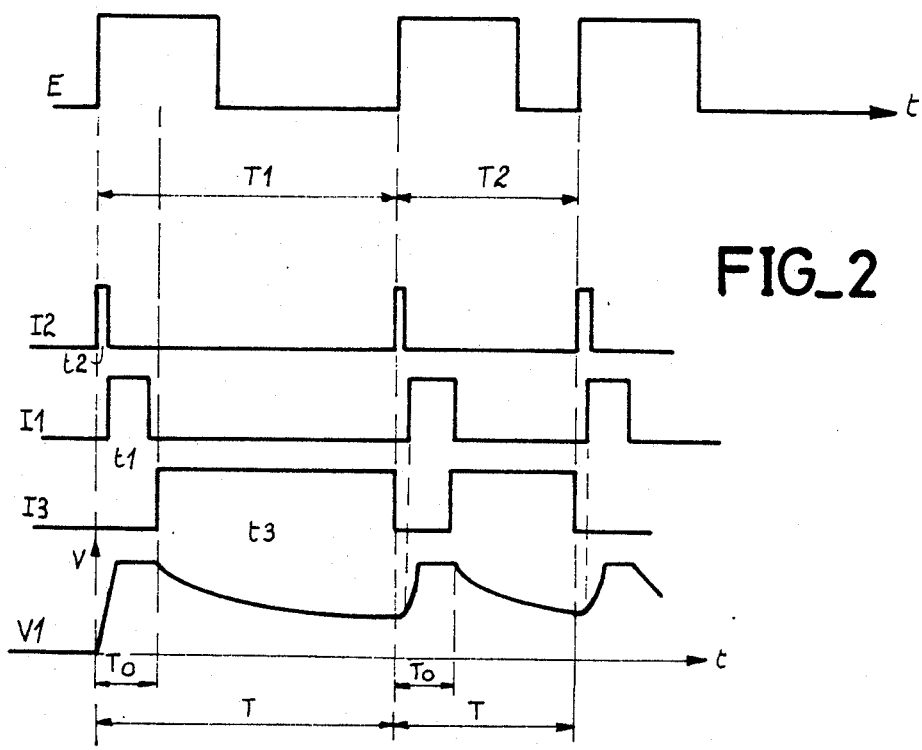
FIG_2

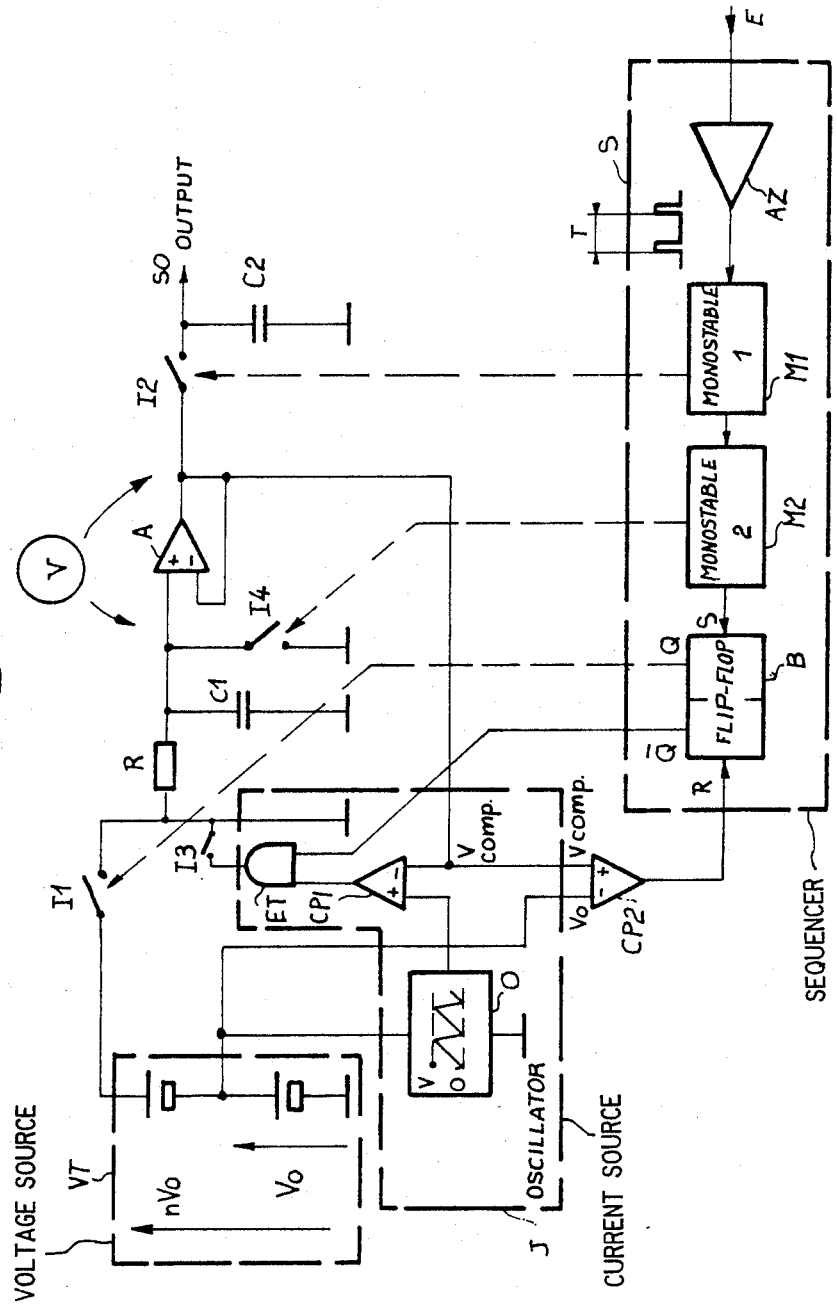
FIG_3

FREQUENCY-VOLTAGE CONVERTER

BACKGROUND OF THE INVENTION

1. Field of the Invention

The present invention relates to frequency-voltage converters which make it generally possible to convert recurrent signals into an electric magnitude proportional to their recurrence frequency, the electric magnitude being very often a voltage level.

2. Description of the Prior Art

When confronted with a recurrent phenomenon and it is desired to measure the recurrence frequency of the phenomenon, it is usual to use a frequency-voltage converter having a monostable multivibrator followed by an RC type filter. Each occurence of the phenomenon triggers the multivibrator which delivers a calibrated pulse. The signal obtained is applied to the input of the filter which delivers a voltage proportional to the number of input pulses per unit of time, that is to say proportional to the frequency it is desired to measure. The drawback of such a device is that the indication of the frequency can only be obtained after a certain number of pulses, which means that this frequency cannot be known instantaneously.

This has in fact not been a real disadvantage as long as it was not required to construct frequency-voltage converters which give a non instantaneous indication of the frequency of the recurrent event and this was the case in the field of automobile electronics, where it was only desired to construct an apparatus for measuring the speed of the engine so as to cause it to appear on the speedometer of the dashboard of the motor vehicle. It was not necessary for the measurement to be instantaneous.

The use of such converters changed however with the appearance of electronic ignition systems. In fact, these systems use as one of their input magnitudes the instantaneous value of the speed of the engine. It is important to provide an electric signal making it possible to identify certain angles of rotation of the engine. The conventional way of doing this is to charge or discharge a DC capacitor, from a voltage initialized at each period. Then, so that the instantaneous voltage represents the angle of rotation of the engine, the discharge current must be proportional to the speed, but during acceleration or deceleration of the engine, measurement of the speed is erroneous, the angle information is falsified and the whole ignition cycle is compromised.

Such a system cannot give good results for it does not have available, at each period, the true value of the instantaneous frequency.

The present invention overcomes this drawback by providing a frequency-voltage converter which makes it possible to known the instantaneous value of the recurrence frequency of a phenomenon, that is to say the value of the frequency for a recurrence with respect to the preceding recurrence, that is to say again the inverse of the last period.

SUMMARY OF THE INVENTION

The present invention provides then a frequency-voltage converter having a voltage source; first energy storage means; a discharge current generator for the first storage means; a sequencer receiving a recurrent signal whose recurrence frequency can be varied; further comprising second energy storage means, the first means being charged to a value Vo after a time To established by the sequencer, then discharged by a discharge current Jd proportional to the square of the instantaneous residual voltage during a time T-To established by the sequencer; the residual charge which is present in the first storage means after the time T being recopied at the beginning of each recurrence into the second storage means.

BRIEF DESCRIPTION OF THE DRAWINGS

Other features and advantages of the invention will be clear from reading the following detailed description with reference to the accompanying drawings, given by way of non limitative examples and in which:

FIG. 1 shows the general diagram of a converter of the invention,

FIG. 2 shows a timing diagram relative to FIG. 1, and

FIG. 3 shows the diagram of a particular embodiment of the converter of the invention.

DESCRIPTION OF THE PREFERRED EMBODIMENTS

In FIG. 1 has been shown the voltage source VT for charging a first capacitor C1 through a switch I1 to a value Vo. Discharge of capacitor C1 is achieved from a current source J and a switch I3 placed between this source J and a terminal N of capacitor C1. An operational amplifier A, connected as a voltage follower with low output impedance, has its positive input connected to the terminal N of capacitor c1 and its output connected to its negative input. It makes it possible to know the value of the voltage of the terminals of capacitor C1 at all times.

A second capacitor C2 is connected so as to be able to store a charge under a voltage equal to that of the first capacitor. A switch I2 connected between the output of amplifier A and a terminal M of capacitor C2 allows the transfer of energy or not. Opening and closing of the switches are controlled by a sequencer S which creates the control signals from the recurrent input signal E.

Sequencer S is tripped by this input signal E and delivers a control signal for closing switch I2 so as to cause storage of the charge proportional to the residual voltage V of capacitor C1 in capacitor C2. The sequencer S then controls opening of switch I2, then closure of switch I1 for a time To so as to charge the capacitor C1 to the value Vo. The time for transferring the residual voltage V is negligible with respect to the time for storing the charge voltage at voltage Vo. At the end of time To and for the rest of the period in progress, that is to say for a time To-T, a discharge current Jd is applied proportional to the square of the instantaneous voltage of capacitor C1 measured for convenience at the output of the amplifier. The end of period T triggers loading of the residual value C1V of capacitor C1 into capacitor C2.

The current Jd is chosen so that the voltage stored by capacitor C2 is proportional to the inverse of the period T, $$Jd = (V^2 C1 / V_o I_o)$$

(C1 representing the value of the capacitor referenced C1).

The current source may be formed for example by means of Gilbert type multipliers which are currently manufactured in the form of integrated monolithic circuits.

In fact, such a multiplier is capable of delivering a voltage (or current) proportional to the square of an input voltage when this voltage is applied to both its inputs.

In FIG. 2, a timing diagram has been shown, for the signals controlling switches I1, I2, I3, of the incident signal E and of the voltage at the terminals of the capacitor C1.

Signal E is a signal with a periodicity, this periodic signal is obtained for example at the output of a speed sensor when it is a question of knowing the speed of a motor vehicle for advancing the ignition.

Signal E has a recurrence period which can be varied when the original physical recurrent phenomenon has a frequency which varies. This is the case, following the preceding example, when the speed of an engine is measured and when the engine undergoes an acceleration or a deceleration.

For illustrating this phenomenon, a first phase 1 has been shown with a period of duration T1 and a second phase II with a period of duration T2.

On the arrival of a pulse of signal E, switch I2 is closed for a time T2, it is open for the rest of the period that is to say for the time T-t2. The closure of switch I2 makes it possible to store the voltage V of capacitor C1 in capacitor C2.

Switch I1 is closed for charging capacitor C1 to a value Vo for a time T1 which may be equal to To so that the capacitor is charged to V1 at time To. Switches I2 and I3 are open. The rest of the period T-to, switch I3 is closed, and capacitor C1 discharges through application of the discharge current Jd.

During the next period, the procedure is the same, capacitor C2 is charged by the residual voltage V of capacitor C1, switch I2 being closed for that. Capacitor C1 is charged so as to have the voltage Vo at time To. This capacitor is then discharged by the current Jd. Since the period of this second phase is shorter than that of the first phase, capacitor C1 is consequently discharged by a smaller amount, the voltage at its terminals, which is transferred to the terminals of capacitor C2 at the end of the period in progress, represents this variation instantaneously.

In FIG. 3, a particular embodiment of the converter of the invention has been shown.

To obtain the time base To, a voltage source VT is used corresponding to n.Vo, n being a real number. A resistor R is connected between switch I1 and capacitor C1. When switch I1 is closed, with switched I3 and I4 open, the voltage nVo is applied to resistor R. Switch I4 is connected in parallel across capacitor C1. Capacitor C1 charges with a time constant RC1 and in accordance with the following law:

$$V = nVo(1 - e^{(-t/RC1)}).$$

So that t=To when V=Vo, n is predetermined so that:

$$To = RC1 \log(n/n-1)$$

the sequencer S includes a matching amplifier AZ receiving the input signal and transforming the signal into pulses. A monostable M1 is connected in series with amplifier AZ for controlling switch I2. A monostable M2 is tripped by the monostable M1 for controlling switch I4. A flip flop B of RS type is controlled by the monostable M2 for controlling the switches I1 and I3.

The circuit J for the discharge current includes a saw tooth oscillator O, two comparators CP1, CP2 and an AND gate. This circuit, in this particular embodiment, makes it possible to have a hyperbolic discharge of capacitor C1. For, of course, the discharge current is, in accordance with the invention, proportional to $V^2$; This current is obtained through the preferred embodiment of the invention, described hereafter.

The oscillator is connected to the terminals of a voltage source Vo. The voltage at its output is a saw tooth and varies between the values 0 volt and Vo. This voltage is applied to an input of the comparator CP1, the other input of the comparator being connected to the output of amplifier A for receiving the voltage level V. The output of comparator CP1 is connected to an input of the AND gate, the other input of the gate is connected to the inverted output of flip flop B. If we adopt as convention that a high level (logic level 1) controls the closed state of a switch, the non inverted output of the flip flop allows switch I1 to be controlled. The comparator CP2 receives at one input voltage Vo and at the other input the output voltage V of the amplifier. The output of comparator CP2 is connected to the R input of the flip flop.

The monostable M1 tripped by the input signal E causes closure of I2 for storing the instantaneous value of the charge C1V of capacitor C1 in capacitor C2. The switches I1 and I4 are open. The position of switch I3 is immaterial.

Following this first step, the monostable M2 tripped by the end of step 1 controls the closure of switch I4 for discharging capacitor C1 to zero volt, switches I1 and I2 are open, the position of I3 is immaterial.

In a third step, the flip flop B tripped by the end of the second step keeps switches I1 closed and I3 open. The switches I2 and I4 are open. Capacitor C1 is charged.

In a fourth step, when the voltage at the terminal of the capacitor is equal to Vo, with this information given by the comparator CP2, the Q output of the flip flop causes opening of I1. Switches I2 and I4 remain open. Switch I3 opens and closes alternately and closure thereof only lasts each time for the whole time that voltage V is less than the voltage of an oscillator O; this information is given by the comparator CP1. Oscillator O is chosen so that its period is much shorter than the shortest period to be measured.

The discharge current in R, (namely V/R) therefore only passes for the fraction V/Vo of the time.

Thus a current is obtained of "mean" value Jd such that $$Jd = (V^2/RVo).$$

This is the average taken over a short time with respect to the period of the signal and long with respect to the period of the oscillator.

This fourth step continues until a new pulse obtained from the input signal triggers a new step 1.

The residual voltage V is therefore directly proportional to the value 1/T (that is to say to the recurrence frequency). In fact, at the end of a time:

$$t = T,$$

$$V = (VoTo/T).$$

Consequently, the real frequency is known, that is to say the inverse of the period as soon as the period is finished, by measuring the voltage at the output SO.

The switches I1, I2, I3, I4 may be made either from bipolar transistors operating in saturated-disabled mode, or from field effect transistors or from any other means known to a man skilled in the art.

The converter may be in the form of a monolithic integrated circuit.

What is claimed is:

1. A frequency-voltage converter comprising:
   a voltage source connected to a first energy storage means for storing energy;
   a current source connected to said first energy storage means, and a second energy storage means for storing energy connected to said first energy storage means;
   a sequencer which receives a recurrent signal which has a recurrence frequency which can be varied, said sequencer connecting to said current source;
   said first energy storage means being charged to a value Vo after a time To which is determined by said sequencer, after said value Vo is attained, said first energy storage means discharges a current Jd, said current Jd being proportional to a squared value of an instantaneous residual voltage on said first energy storage means during a time interval T-To determined by said sequencer;
   means for transferring a residual charge present in said first energy storage means after a period T to said second energy storage means at the beginning of each recurrence of said period T.

2. The converter of claim 1, wherein:
   the first energy storage means comprises a first capacitor and the second energy storage means comprises a second capacitor, a first switch being connected to the first energy storage means and a second switch being connected to the second energy storage means, said first switch and said second switch actuated by control signals from said sequencer for purposes of charging said first capacitor and said second capacitor.

3. The converter of claim 2, further comprising:
   means for measuring the instantaneous residual voltage of the first capacitor, said means for measuring being connected to the current source which maintains the discharge current Jd, and said means for measuring the instantaneous voltage connecting to the first capacitor.

4. The converter of claim 3, further comprising:
   a third switch connected to said current source and said first capacitor, said discharge current Jd flowing from said current source and through said third switch when said third switch is closed.

5. The converter according to claim 4, wherein:
   said current source having as an output the discharge current Jd, said discharge current Jd being equal to a product of a capacitance of the first capacitor and a squared instantaneous residual voltage divided by a product of the time To and the value Vo.

6. The converter according to claim 5, wherein:
   said current source comprises an oscillator having an output voltage which varies between 0 and Vo;
   a first comparator having a first input and a second input, said first comparator receiving the output voltage from said oscillator at its first input, and the output of said means for measuring the instantaneous voltage connecting to the second input of said first comparator;
   an AND gate having a first input and a second input, an output of the first comparator connected to said first input of said AND gate;
   a flip flop having an inverted output, said second input of said AND gate connected to said inverted output of said flip flop; and
   an output of said AND gate connecting to the third switch, and a fourth switch being connected in parallel across said first capacitor.

7. The converter of claim 6, wherein:
   said voltage source has a voltage nVo, n being a real number;
   said first energy storage means connects to a resistor, said resistor being connected between the first switch and the first capacitor, the voltage nVo being applied to the resistor, the first capacitor being charged for a time To which is dependent on a time constant RC1; and,
   a second comparator has a first input and a second input, said second comparator being connected to said voltage source and said current source, said second comparator receiving the voltage Vo at its first input and said second comparator receiving an output voltage of said means for measuring the instantaneous voltage at its second input, said second comparator connecting to said sequencer, said sequencer comprised of control means for opening and closing said first switch.

8. The converter of claim 7, wherein:
   said sequencer comprises a first monostable, said first monostable being used to activate the second switch;
   said first monostable being connected to a second monostable, said second monostable being used to activate the fourth switch.

9. The converter of claim 8, wherein:
   the sequencer comprises the flip flop, the flip flop being an RS type flip flop;
   the flip flop being triggered by the second monostable and by an output signal of the second comparator, the flip flop being electrically connected to the first switch and to the second input of the AND gate.

10. The converter of claim 3, wherein:
    said means for measuring the instantaneous residual voltage comprises an operational amplifier.

* * * * *